United States Patent
Zingg et al.

(10) Patent No.: US 10,680,621 B1
(45) Date of Patent: Jun. 9, 2020

(54) PHASE STABILIZATION FOR A FREQUENCY MULTIPLIER

(71) Applicant: Keysight Technologies, Inc., Santa Rosa, CA (US)

(72) Inventors: Reto Zingg, Santa Rosa, CA (US); Victor M. Grothen, Winsor, CA (US); Wayne Lee Johnson, Santa Rosa, CA (US); Lucia Cascio, Santa Rosa, CA (US); Hsiang-Yi Chung, Santa Rosa, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 16/289,493

(22) Filed: Feb. 28, 2019

(51) Int. Cl.
*H03L 7/081* (2006.01)
*H03L 7/08* (2006.01)
*H03L 7/093* (2006.01)

(52) U.S. Cl.
CPC .......... *H03L 7/0812* (2013.01); *H03L 7/0805* (2013.01); *H03L 7/093* (2013.01)

(58) Field of Classification Search
USPC .................................. 327/147–149, 156–158
See application file for complete search history.

(56) References Cited

U.S. PATENT DOCUMENTS

| 4,253,051 | A | * | 2/1981 | Schneider | ................ | G01D 3/06 |
| | | | | | | 318/608 |
| 4,663,541 | A | * | 5/1987 | Larrowe | ............... | H03L 7/0812 |
| | | | | | | 327/119 |
| 8,749,282 | B1 | * | 6/2014 | Basawapatna | .......... | H03L 7/104 |
| | | | | | | 327/147 |
| 9,094,028 | B2 | * | 7/2015 | Hossain | .................. | H03L 7/235 |
| 2004/0104781 | A1 | * | 6/2004 | Caresosa | ................... | H03L 7/18 |
| | | | | | | 331/57 |
| 2004/0214547 | A1 | * | 10/2004 | Kim | ..................... | H03D 7/1433 |
| | | | | | | 455/296 |
| 2008/0290953 | A1 | * | 11/2008 | Sandner | .................... | H03L 7/23 |
| | | | | | | 331/2 |
| 2009/0061810 | A1 | * | 3/2009 | Petrovic | ................... | H03D 7/00 |
| | | | | | | 455/323 |
| 2009/0268091 | A1 | * | 10/2009 | Kouyama | ............... | H03L 7/183 |
| | | | | | | 348/515 |
| 2012/0062287 | A1 | * | 3/2012 | Jang | ..................... | H03B 5/1228 |
| | | | | | | 327/156 |
| 2013/0086410 | A1 | * | 4/2013 | Kurd | ......................... | G06F 1/08 |
| | | | | | | 713/501 |
| 2013/0106476 | A1 | * | 5/2013 | Joubert | ..................... | H03L 1/00 |
| | | | | | | 327/156 |
| 2013/0113630 | A1 | * | 5/2013 | Cornwall | ................. | H04Q 9/00 |
| | | | | | | 340/870.02 |
| 2015/0226556 | A1 | * | 8/2015 | Aaltonen | .......... | G01C 19/5712 |
| | | | | | | 73/504.12 |
| 2017/0353171 | A1 | * | 12/2017 | Ito | .......................... | H03H 9/562 |

(Continued)

FOREIGN PATENT DOCUMENTS

JP       H10303708 A       11/1998

*Primary Examiner* — Adam D Houston

(57) ABSTRACT

A frequency multiplier circuit includes a frequency multiplier, a phase detector and a control circuit. The phase detector detects a difference between an input phase of an input to the frequency multiplier and an output phase of an output from the frequency multiplier. The control circuit is configured to maintain the output phase based on the difference detected by the phase detector.

20 Claims, 9 Drawing Sheets

600A

(56) References Cited

U.S. PATENT DOCUMENTS

| | | | |
|---|---|---|---|
| 2018/0269881 A1* | 9/2018 | Chang | H03L 1/04 |
| 2019/0007055 A1* | 1/2019 | Nelson | G06F 1/10 |
| 2019/0041215 A1* | 2/2019 | Sanders | G02B 6/02328 |
| 2019/0225099 A1* | 7/2019 | Sieber | B60L 53/12 |

* cited by examiner

PHASE STABILIZATION FOR A FREQUENCY MULTIPLIER

BACKGROUND

A frequency multiplier is an electronic circuit that takes in a periodic input signal with an input frequency f and multiplies the input frequency f by a factor N to generate an output signal with an output frequency N*f. The output frequency N*f is a harmonic of the input frequency f, where N is an integer two or larger. A block diagram of a known frequency multiplier is illustrated in FIG. 1A. The frequency multiplier 111 in FIG. 1A generates the output frequency N*f, but will inevitably also generate unwanted harmonics Mi*f, where Mi represents integers one or larger but not equal to N. In other words, the output signal from the frequency multiplier 111 will contain signal components at all harmonics of the input frequency f, but only the harmonic at the output frequency N*f is desired. A filter 112 or combination of multiple such filters may be used to suppress the signal components at the unwanted harmonics Mi*f of the output of the frequency multiplier 111, resulting in the output signal with the output frequency N*f. Signal components at the unwanted harmonics Mi*f may still be present despite the filtering but the signal components at the unwanted harmonics Mi*f are low enough in amplitude that the unwanted harmonics Mi*f can be tolerated.

Demand for multi-channel instruments has increased. Multi-channel instrumentation is becoming more common in diverse fields such as wireless communications, quantum computing, aerospace and defense. Multi-channel instruments may work in multiple clock domains and utilize clocks that operate at multiple different frequencies. In multi-channel instruments, one clock frequency may be derived from another clock frequency using a frequency multiplier, a frequency divider, or a frequency converter. Waves at related frequencies may be expected to have a consistent phase relationship. Two waves at the same frequency may be offset from one another in time but will still have a strong relationship. For example, two offset waves at the same frequency will have periodic peaks, lows and crossings of zero separated by the same amount of time, even if the peaks and lows of the two offset waves are at different amplitudes. Two waves with different frequencies will not have the strong relationship of two waves at the same frequency, but two waves of different frequencies may still have a phase relationship of some form. For example, a second wave with a frequency that is an integer multiple of a first wave would be expected to have one or more reoccurring characteristics that coincide with one or more reoccurring characteristics of the first wave, just not at the same magnitude of similarity as if they were at the same frequency. Typically, within a single instrument or a system of multiple instruments, frequency generation elements are phase-locked to a lower input frequency reference, so that a consistent phase relationship is expected to result. For example, an instrument or system of instruments may include digital signal processing structures with maximum clock rates in the hundreds of MHz, and a high-speed digital-to-analog converter (DAC) or analog-to-digital converter (ADC) with clock rates in the multiple GHz range. Phase coherence between the multiple channels of multi-channel instruments is often required, and tight synchronization of events within individual multi-channel instruments or across multi-channel systems is often essential and dependent on the phase coherence.

FIG. 1B illustrates an example of a reference frequency system in which multiple frequencies are derived from an input frequency f1 as a reference. In FIGs. herein, any frequency multiplier may be shown as a single block even though the frequency multiplier may itself be an electronic circuit that includes multiple components. The illustration of a frequency multiplier as a single block reflects that a frequency multiplier circuit is a circuit in which the frequency multiplier is functionally an individual component and the frequency multiplier circuit includes one or more additional components. In FIG. 1B, the reference frequency system 100 includes a first frequency multiplier 111a, a second frequency multiplier 111b, a third frequency multiplier 111c, and a fourth frequency multiplier 111d. In FIG. 1B, the input frequency f1 is analogous to the input frequency f in FIGS. 1A and 1s an input frequency reference that is input to the first frequency multiplier 111a, the second frequency multiplier 111b, the third frequency multiplier 111c, and the fourth frequency multiplier 111d. Overall, FIG. 1B illustrates a reference frequency system 100 in which multiple clocks are derived from a common clock. The derivation of multiple clocks as in FIG. 1B may be in the same instrument, or in multiple instruments with a common clock, or even at multiple sites. Each of the first frequency multiplier 111a, the second frequency multiplier 111b, the third frequency multiplier 111c, and the fourth frequency multiplier 111d may be in a different circuit, and each of these circuits may have different topologies. Each of the different circuits may also have their own phase-drift over temperature, so that the output signals from the different circuits have relative phase drifts (within bounds), even though the output frequencies of the output signals are all derived from the same common reference clock. Accordingly, minimizing the individual phase-drift of each circuit in FIG. 1B may be important regardless of the actual values of each derived frequency. Phase drift may occur even when two such circuits generate the same frequency, when, for example, the two frequencies are not co-located, or when the two circuits emphasize a different aspect of performance.

The first frequency multiplier 111a in FIG. 1B is a component of a first frequency translation circuit that also includes a first phase detector 120a, a first integrator 132a, and an oscillator 191. The first frequency multiplier 111a multiplies the input frequency f1 by N1 and outputs a first multiplied result f1×N1 to a first phase detector 120a. The first phase detector 120a is an example of a phase detector that detects a first phase difference between the first multiplied result f1×N1 and a second frequency f2. The first integrator 132a is an example of an integrator which provides a first integrated result to an oscillator 191. The second frequency multiplier 111b is a component of a second frequency translation circuit that also includes a digital-to-analog converter 196. The second frequency multiplier 111b multiplies the input frequency f1 by N2. The digital-to-analog converter 196 may be a high-speed digital-to-analog converter and may have direct digital synthesis. The third frequency multiplier 111c is a component of a third frequency translation circuit. The third frequency multiplier 111c multiplies the input frequency f1 by N3. The fourth frequency multiplier 111d is a component of a fourth frequency translation circuit that also includes a second phase detector 120b, a frequency divider 198, a second integrator 132b and a oscillator 192.

In FIG. 1B, the first frequency translation circuit outputs a first output signal at the second frequency f2. The second frequency translation circuit outputs a second output signal at the third frequency f3. The third frequency translation circuit outputs a third output signal at the fourth frequency f4. The fourth frequency translation circuit outputs a fourth output signal at the fifth frequency f5. The phases of the first frequency f1, the second frequency f2, the third frequency f3, the fourth frequency f4 and the fifth frequency f5 may drift (within bounds) relative to one another with time and temperature, even though the different frequencies are phase-locked together. The drift may occur even if any two or more of the first frequency f1, the second frequency f2, the third frequency f3, the fourth frequency f4 and the fifth frequency f5 is the same, such as when two translation circuits are not co-located or when they emphasize a different aspect of performance. The drift will impact the multi-channel coherence and synchronization of events within and across the reference frequency system 100, and this is typical for many multi-channel instruments. The drift can be an issue in a system where phase relation of signals at the input to the system and the output from the system are important.

Often, the primary contributor to drift for any particular multiplied result is the frequency multiplier that produces the multiplied result. A primary problem with frequency multipliers may lie with the filter(s) such as the filter 112. The filter(s) require sharp roll-off near the pass-band to sufficiently suppress the unwanted harmonics. Filters with sharp roll-off have a steep phase versus frequency slope well into the pass-band. When the filter shifts slightly due, for example, to temperature change, the phase delay through the filter will change at a given frequency. The phase of the output signal relative to the phase of the input signal becomes dependent on the temperature of the reference frequency system 100.

Frequency multipliers with shifting phases are therefore unstable and will benefit from stabilization as described herein.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1A:
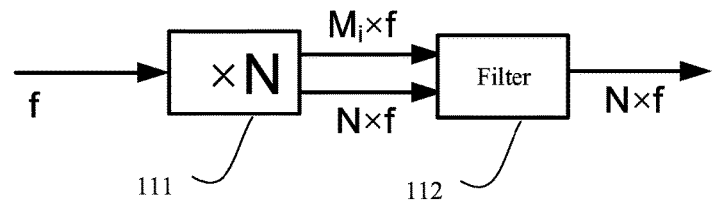
FIG. 1A illustrates a block diagram of a known frequency multiplier.
Figure 1B:
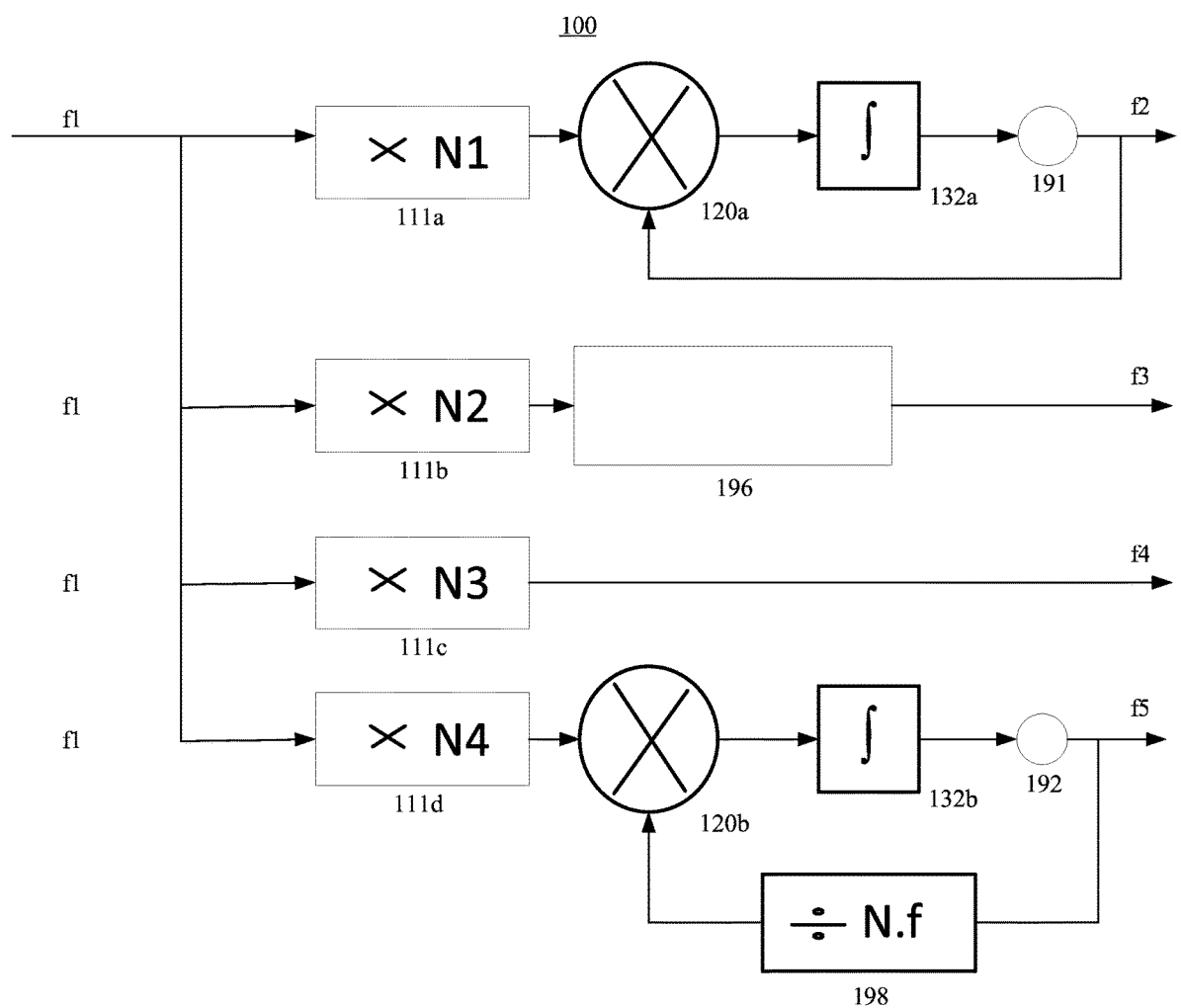
FIG. 1B illustrates an example of a reference frequency system in which multiple known frequency multipliers are driven by a common input frequency as a reference.

In the following detailed description, for purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only and is not intended to be limiting. The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the present disclosure.

The terminology used herein is for purposes of describing particular embodiments only and is not intended to be limiting. As used in the specification and appended claims, the singular forms of terms 'a', 'an' and 'the' are intended to include both singular and plural forms, unless the context clearly dictates otherwise. Additionally, the terms "comprises", and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to", "coupled to", or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

In view of the foregoing, the present disclosure, through one or more of its various aspects, embodiments and/or specific features or sub-components, is thus intended to bring out one or more of the advantages as specifically noted below. For purposes of explanation and not limitation, example embodiments disclosing specific details are set forth in order to provide a thorough understanding of an embodiment according to the present teachings. However, other embodiments consistent with the present disclosure that depart from specific details disclosed herein remain within the scope of the appended claims. Moreover, descriptions of well-known apparatuses and methods may be omitted so as to not obscure the description of the example embodiments. Such methods and apparatuses are within the scope of the present disclosure.

As described herein, phase stabilization for a frequency multiplier may be implemented with a control loop added to a frequency multiplier circuit in order to control a variable phase-shift circuit in the main signal path of the frequency multiplier. The control loop and the variable phase-shift circuit may be used to hold the output phase of the output signal from the frequency multiplier steady relative to the input phase of the input signal to the frequency multiplier.

Figure 2:
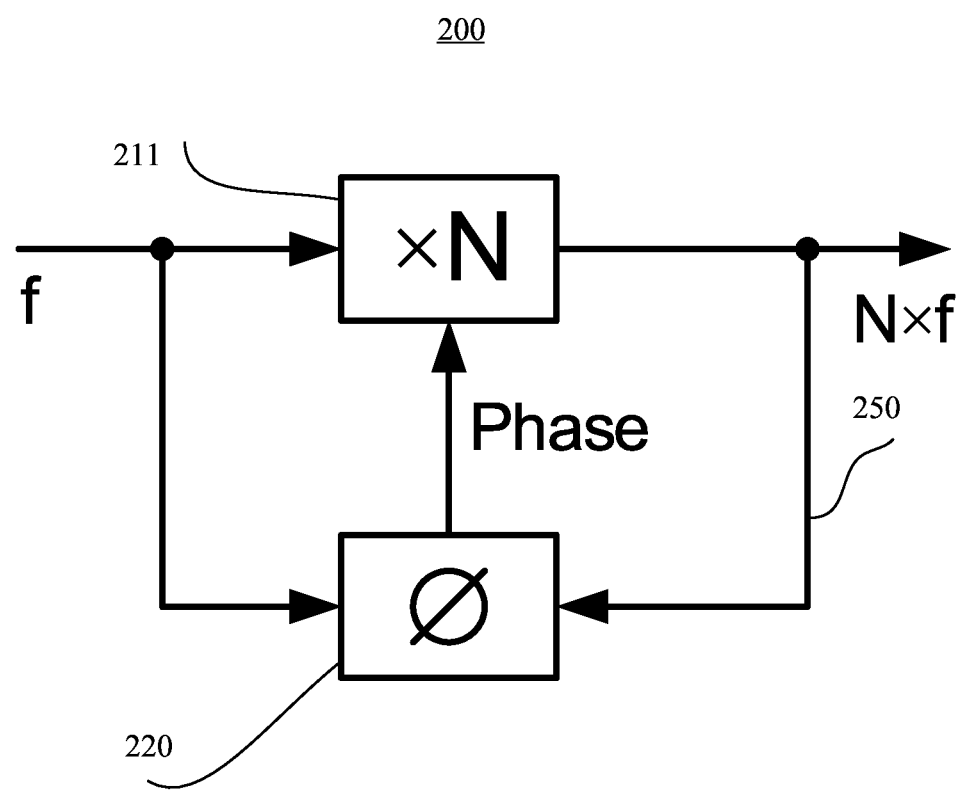
FIG. 2 is a block diagram illustrating a frequency multiplier circuit with phase stabilization, in accordance with a representative embodiment.

FIG. 2 is a block diagram illustrating a frequency multiplier circuit with phase stabilization, in accordance with a representative embodiment.

In FIG. 2, a frequency multiplier circuit 200 includes a frequency multiplier 211 and a phase detector 220. The frequency multiplier circuit 200 in FIG. 2 is simplified compared to other frequency multiplier circuits described herein. In FIG. 2, a first tap-off and a second tap-off are not shown, but may be respectively provided as, for example, directional couplers in the main path before and after the frequency multiplier 211.

The phase detector 220 detects a phase-difference between the input frequency f of the input signal that is input to the frequency multiplier circuit 200 and the output frequency N*f of the output signal from the frequency multiplier circuit 200. In the frequency multiplier circuit 200, the input signal that is input to the frequency multiplier circuit 200 and to the phase detector 220 is also the input to the frequency multiplier 211. The output signal that is output from the frequency multiplier circuit 200 is also the output from the frequency multiplier 211.

The input signal to the frequency multiplier circuit 200 and the output signal from the frequency multiplier circuit 200 are both tapped and provided to the phase detector 220. The phase detector 220 detects the difference between the phase of the input frequency f of the input signal and the phase of the output frequency N*f of the output signal by comparing the phase of the input frequency f of the input signal and the phase of the output frequency N*f of the output signal. However, comparing the phase of the input signal and the phase of the output signal may not be straightforward when the input signal and the output signal have different frequencies. Some phase detectors, such as a sampling phase detector, can compare the phase of the input signal and the phase of the output signal if the factor N is an integer. Other phase detectors, such as a mixer phase detector, require both inputs to the phase detector 220 to be at equal frequencies for the comparison to work. In other words, phase detectors such as a mixer phase detector require both inputs being compared to be at the same frequency. If the phase detector 220 is a phase detector that requires the frequencies of the phases being compared to be the same frequency, a frequency divider can be added in the feed-back path of the output signal from the frequency multiplier circuit 200 between the output of the frequency multiplier 211 and the phase detector 220. Otherwise, the frequency multiplier circuit 200 or other frequency multiplier circuits described herein may specifically not have a frequency divider in the feed-back path, such as when not required.

In the frequency multiplier circuit 200, a main signal line may be considered the horizontal segments into and out of the frequency multiplier 211. The main signal line would be the only signal line present if the frequency multiplier 211 were not accompanied by other elements such as the phase detector 220. The main signal line has tap-offs to tap the input signal to the frequency multiplier circuit 200 and the output signal from the frequency multiplier circuit 200 to provide to the phase detector 220.

The tap-offs from the main signal line in the frequency multiplier circuit 200 may each be implemented by a directional coupler. Each coupler may transfer some of the power from the main signal line to the phase detector 220. By way of explanation, a directional coupler ideally couples only power from a forward traveling wave. The directional coupler is a four-port device, where the fourth port is often terminated in the characteristic impedance. For example, an ideal directional coupler may couple power incident on port 1 such that the larger portion of the incident power exits at port 2, and such that the remaining portion of the incident power exits at port 3. The path from port 1 to port 2 of a directional coupler may be referred to herein as the main path, whereas the path from port 1 to port 3 of a directional coupler may be referred to herein as the coupled path. However, the directional coupler does not couple power incident on port 3 such that it exits from port 2 or power incident on port 2 such that it exits from port 3. In other words, the coupler will couple a signal incident on port 1 by dividing the signal between ports 2 and 3. Actual couplers will have a small amount of leakage of power incident on port 2 and exiting on port 3 and power incident on port 3 and exiting on port 2. A directional coupler is also a reciprocal device. Each of the pour ports behaves as previously described relative to the corresponding other three ports. Port 4 is often terminated in the characteristic impedance. Accordingly, a directional coupler may be used for each tap-offs in the embodiment of FIG. 2 and other embodiments described herein. As a result, reflections of the input signal that is input to the frequency multiplier circuit 200 and reflections to the output signal that is output from the frequency multiplier circuit 200 are not tapped by the first tap-off or the second tap-off.

Additionally, phase stabilization as described herein may be provided for frequency multiplier circuits that effectively multiply frequencies by factors that are not integers. An example of this manner of phase stabilization is provided after the description of FIG. 4 herein.

In the frequency multiplier circuit 200 and other frequency multiplier circuits described herein, all added circuitry off the main signal line, between and including the tap-offs on the main signal line to the phase detector combined should have less phase drift over temperature than the frequency multiplier 211 and other frequency multipliers described herein. Otherwise there is no point in adding additional circuitry for the purposes described herein. The added circuitry includes both the tap-offs, mixers, amplifiers and other circuitry that may be included in frequency multiplier circuits described herein.

Figure 3A:
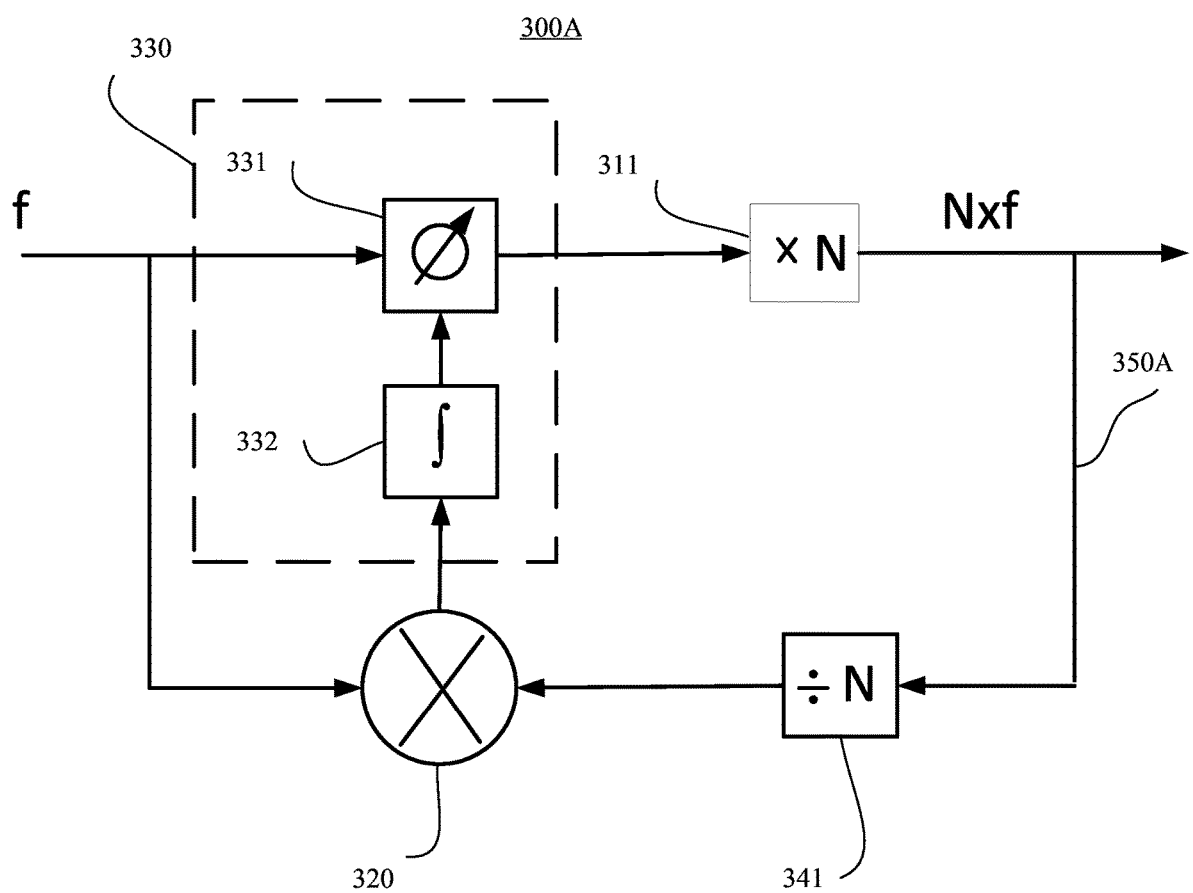
FIG. 3A is a block diagram illustrating another frequency multiplier circuit with phase stabilization, in accordance with a representative embodiment.

FIG. 3A is a block diagram illustrating another frequency multiplier circuit with phase stabilization, in accordance with a representative embodiment.

In FIG. 3A, the frequency multiplier circuit 300A includes a frequency multiplier 311, a phase detector 320, a frequency divider 341 and an analog control circuit 330. The analog control circuit 330 in FIG. 3A includes a variable phase shifter 331 and an integrator 332.

In FIG. 3A, the phase detector 320 detects a difference between an input phase of the input signal that is input to the frequency multiplier circuit 300A and an output phase of the output signal that is output from the frequency multiplier circuit 300A. The phase detector 320 is a phase comparator and may be a sampler, a mixer phase detector, an X—Or phase detector, or any other compatible circuit used for phase detection. In FIG. 3A, a first tap-off and a second tap-off are not shown, but may be respectively provided as, for example, directional couplers in the main path before the variable phase shifter 331 and after the frequency multiplier 311. The phase detector 320 receives the input signal to the frequency multiplier circuit 300A via the first tap-off, and the output signal from the frequency multiplier circuit 300A via the second tap-off.

In the embodiment of FIG. 3A, the input signal to the frequency multiplier circuit 300A is input to the variable phase shifter 331 along with the phase detector 320. The output signal that is output from the frequency multiplier circuit 300A is also the output signal from the frequency multiplier 311 and is also provided to the frequency divider 341. Reflections of the input signal to the frequency multiplier circuit 300A and of the output signal from the frequency multiplier circuit 300A may change over temperature and/or with the state of the variable phase shifter 331, and thus may not be included in the signals from tap-offs that are fed as the two inputs to the phase detector 320. In FIG. 3A, the tap-offs on the main signal line may have directivity, such that only the forward-traveling wave is coupled and such that reflected signals are not included in the tapped-off input signal or the tapped-off output signal. The first tap-off taps input in the frequency multiplier circuit 300A, and specifically in the embodiment of FIG. 3A the input signal that is input to the variable phase shifter 331 in the main signal line. The second tap-off taps output in the frequency multiplier circuit 300A, and specifically in the embodiment of FIG. 3A the output signal that is output from the frequency multiplier 311. The first tap-off and the second tap-off may be implemented as directional couplers, directional power splitters or similar circuits. That is, the first tap-off and the second tap-off prevent coupling of reflections of the input signal that is input to the frequency multiplier circuit 300A and reflections to the output signal that is output from the frequency multiplier circuit 300A. The reflections are not tapped by the first tap-off or the second tap-off, respectively. If the tap-offs have no directivity, then other circuit measures may be used to prevent coupling of backwards traveling waves.

In FIG. 3A, the analog control circuit 330 is a controller. In other embodiments, the analog control circuit 330 includes only the variable phase shifter 331 and not the integrator 332. Functionality of an integrator 332 may be replaced by other control functions from other elements. The analog control circuit 330 is configured to maintain the output phase of the output signal from the frequency multiplier 311 based on the difference between the input phase and the output phase detected by the phase detector 320. In FIG. 3A, the frequency multiplier circuit 300A provides phase stabilization by using a mixer as the phase detector 320 and the integrator 332 as a controller or as an element of a controller.

The analog control circuit 330 is a loop controller that controls a control loop 350A. The analog control circuit 330 can have one of a multitude of implementations as is customary for control circuits. Accordingly, the integrator 332 is used in the embodiment of FIG. 3A but can be replaced or supplemented by other Proportional+Integral+ Differential (PID) implementations. The control loop 350A includes the analog control circuit 330 along with the phase detector 320 and the frequency divider 341. Specifically, the control loop 350A is configured to ensure that both inputs to the phase detector 320 are at the same frequency, such as when the phase detector 320 is the mixer phase detector or another type of phase detector that requires two inputs to be at the same frequency. The control loop 350A is also configured to ensure that the difference between the input phase and the output phase is detected by the phase detector 320 and that the integrator 332 integrates the difference detected by the phase detector 320 and provides the integrated difference to the variable phase shifter 331. The variable phase shifter 331 in the control loop 350A adjusts the phase delay through the main forward path of the frequency multiplier circuit 300A based on the difference detected by the phase detector 320 so that the phase of the output signal from the frequency multiplier circuit 300A is adjusted to follow the phase of the input signal to the frequency multiplier circuit 300A. The bandwidth of the control loop 350A may be relatively low since temperature variations are slow. A bandwidth of the control loop 350A may be in the range of 1 milli-Hertz to 90 Hertz for example.

The variable phase shifter 331 is an electrically controllable phase shifter and can be implemented in one of a multitude of ways. For example, the variable phase shifter 331 may be implemented as an inductor-capacitor-inductor-capacitor-inductor (L-C-L-C-L) delay line, where the inductors (L) are in series and the capacitors (C) are shunt elements, and the capacitors (C) are implemented by variable capacitors which have voltage-variable capacitance, leading to a voltage variable delay through the circuit.

Depending on the type of phase detector used for the phase detector 320, the inputs to the phase detector 320 may require conditioning. For example, a mixer phase detector as the phase detector 320 may be limited to comparing signals of the same frequency, in which case either the inputs need to be multiplied up in frequency, or the output signal divided down in frequency. Dividing down the output signal may be favorable, as division may not require filters and hence may present much less delay variation over temperature.

The frequency divider 341 may add phase uncertainty to the feed-back path. The frequency divider 341 can start at any of the N cycles of the output signal N*f within one cycle of the input signal with the input frequency f. To prevent this uncertainly the frequency divider 341 may be synchronized to the input signal that is input to the frequency multiplier circuit 300A. This can be achieved in several different ways. For example, the frequency divider 341 may be started or reset by the input signal that is input to the frequency multiplier circuit 300A if the frequency divider 341 has such functionality. Alternatively, as explained with respect to FIG. 4 later, a trial and error approach can be taken, interrupting the signal to the frequency divider 341 repeatedly until the frequency divider 341 is in the correct state by chance. Depending on the tuning range of the variable phase shifter 331, the control loop 350A may only lock when the frequency divider 341 is in the correct state. If the control loop 350A can lock at multiple states of the frequency divider 341, then the correct state may be detected by referring to the control voltage provided from the integrator 332 to the variable phase shifter 331.

Figure 3B:
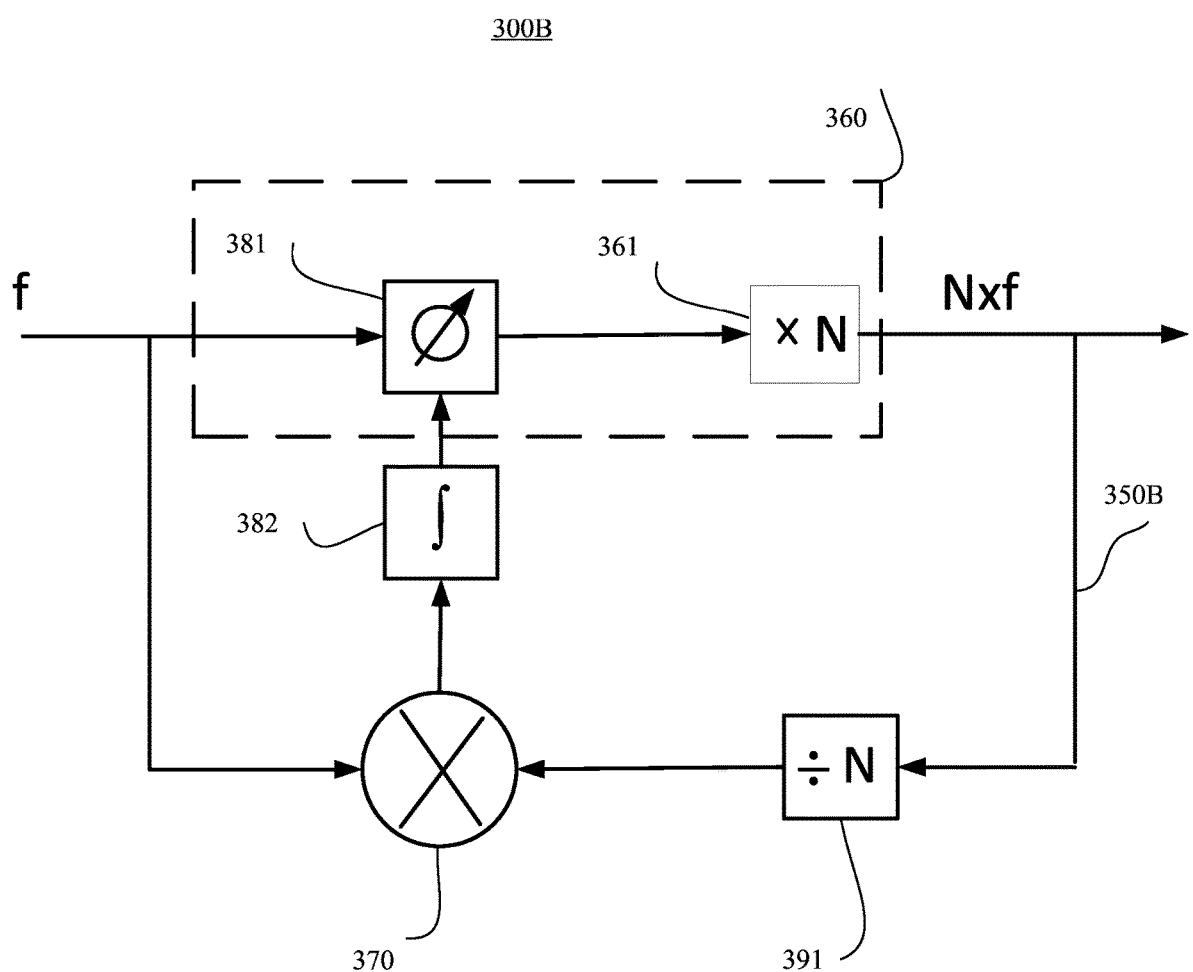
FIG. 3B is another block diagram illustrating the frequency multiplier circuit with phase stabilization in FIG. 3A, in accordance with a representative embodiment.

FIG. 3B is another block diagram illustrating the frequency multiplier circuit with phase stabilization in FIG. 3A, in accordance with a representative embodiment.

In FIG. 3B, the frequency multiplier circuit 300B includes a phase shift circuit 360, a phase detector 370, an integrator 382, and a frequency divider 391. The phase shift circuit 360 includes a variable phase shifter 381 and a frequency multiplier 361.

In FIG. 3B, the control loop 350B includes the frequency divider 391, the phase detector 370, the integrator 382, the variable phase shifter 381, and the frequency multiplier 361. Additionally, insofar as the combination and arrangement of elements in FIG. 3B is the same as the combination and arrangement of elements in FIG. 3A, it should be clear that a controller which is an analog control circuit may include both the integrator 382 and/or the variable phase shifter 381 though the controller is not separately labelled in FIG. 3B.

Figure 4:
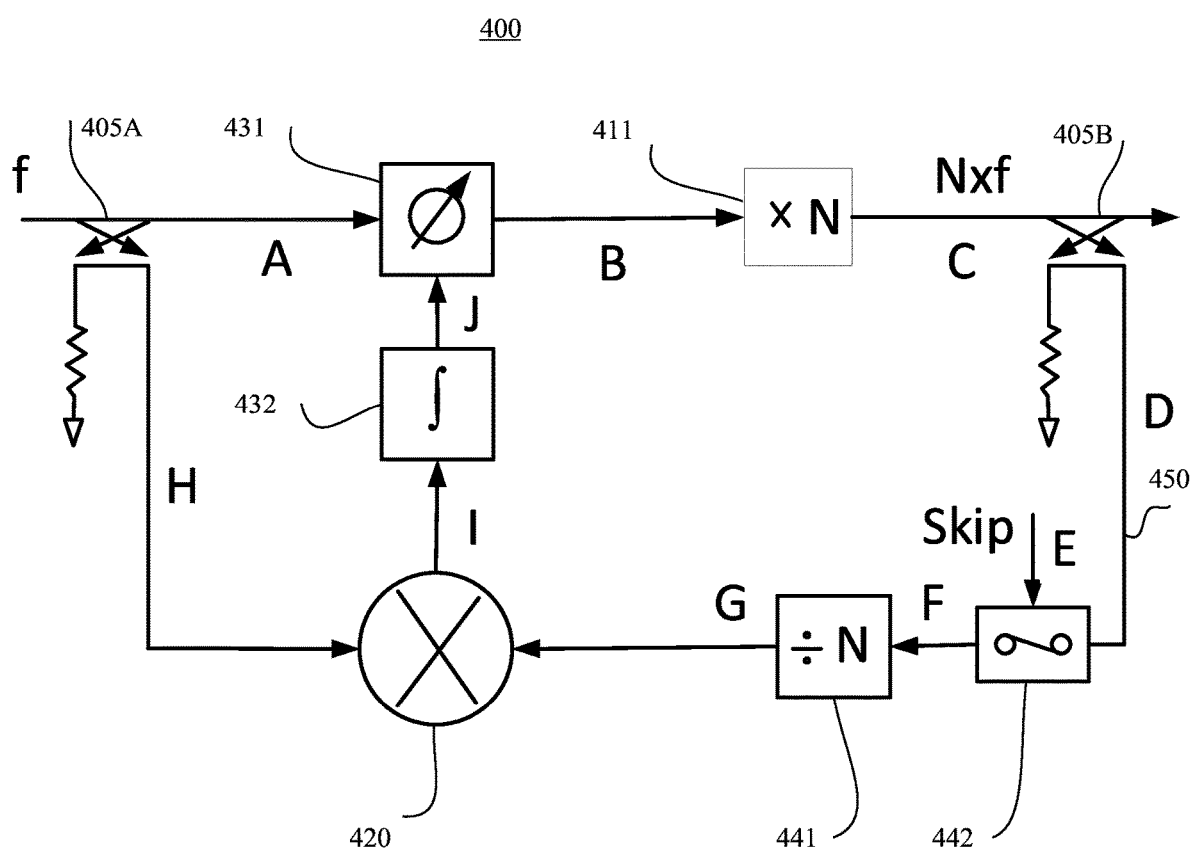
FIG. 4 is a block diagram illustrating another frequency multiplier circuit with phase stabilization, in accordance with a representative embodiment.

FIG. 4 is a block diagram illustrating another frequency multiplier circuit with phase stabilization, in accordance with a representative embodiment.

In FIG. 4, the frequency multiplier circuit 400 includes a first tap-off 405a, a second tap-off 405b, a phase shifter 431, a frequency multiplier 411, a switch 442, a frequency divider 441, a phase detector 420 and an integrator 432.

In FIG. 4, the first tap-off 405A taps an input in the frequency multiplier circuit 400, and specifically the input to the frequency multiplier circuit 400. The second tap-off 405B taps an output in the frequency multiplier circuit 400, and specifically the output from the frequency multiplier circuit 400 which is also the output from the frequency multiplier 411. The first tap-off 405A may directionally tap an input in the frequency multiplier circuit 400 and the second tap-off 405B may directionally tap an output in the frequency multiplier circuit 400, and the directionality of the taps by the tap-offs may be true of any other embodiment described herein.

In FIG. 4, the integrator 432 and/or the phase shifter 431 may be a controller which is an analog control circuit. The phase detector 420 is a phase comparator, though phase comparison may be implemented in several different ways. A control loop 450 includes the switch 442, the frequency divider 441, the phase detector 420, the integrator 432, the phase shifter 431, and the frequency multiplier 411. The switch 442 in the control loop 450 is selectively turned off and on until an output phase of the output signal from the frequency divider 441 is in one of N phase-states that will cause an output signal from the phase detector 420 to be closest to zero volts. The control loop 450 will adjust phase using the phase shifter 431 until the output signal from the phase detector 420 is zero volts. The output from the phase detector 420 is zero volts when zero volts are input to the integrator 432 since zero volts results is steady-state. Anything other than zero volts at the input to the integrator 432 causes the integrator 432 output to ramp up or down. The phase relation of the two inputs to the phase detector 420 that will cause zero volt output depends on the implementation of the phase detector 420. For example, for an ideal mixer phase detector, quadrature is required such that the two inputs are 90° out of phase. The frequency multiplier circuit 400 provides phase stabilization that can be implemented in a vector signal generator, other multi-channel instrumentation, or any other circuit requiring stable phase of the output relative to the input. As should be clear, the frequency multiplier circuit 400 or other frequency multiplier circuits described herein may include other circuit components such as amplifiers in the paths to the phase detector 420 to ensure the phase detector 420 is provided with input signals with adequate signal power.

Selection of components for the frequency multiplier circuit 400 may depend on the required performance of the circuit. For example, if very low phase noise is required, then the phase detector 420 may be a mixer phase detector since a mixer phase detector can outperform a sampler phase detector in terms of low phase noise. Additionally, the control loop 450 will have less likelihood of impacting the phase noise of the input signal with the input frequency f when the bandwidth of the control loop is set narrower. This is true since the phase noise of any input signal with input frequency f at low offset frequencies will have a slope of at least −20 dB/decade. That is, the lower the offset frequency, the higher the phase noise of the signal through the frequency multiplier 411, so the less likely the phase noise of the signal through the frequency multiplier 411 is to be impacted by the noise of the components in the control loop 450 which are used to stabilize the phase of the input signal and the output signal as described herein.

In FIG. 4, nodes in the frequency multiplier circuit 400 are labelled A through J. At the first node A, the input signal with the input frequency f is present after the tapping by the first tap-off 405A. The input signal with the input frequency f that is present at node A is the main input to the phase shifter 431 in the main path of the frequency multiplier circuit 400. At the second node B, the output signal from the phase shifter 431 is present and is also the input signal to the frequency multiplier 411. At the third node C, the output signal from the frequency multiplier 411 with the output frequency N×f is present before tapping by the second tap-off 405B. At the fourth node D, the tapped output signal from the second tap-off 405B is present and is the input in the control loop 450 to the switch 442. At the fifth node E, a timing control signal is also input to the switch 442, to control the switch 442 with a skip signal. At the sixth node F, the output signal from the switch 442 is present as the input signal to the frequency divider 441. At the seventh node G, the output signal from the frequency divider 441 is present as the feedback input signal to the phase detector 420. At the eight node H, the tapped input signal from the first tap-off 405A is present and is the other input signal to the phase detector 420. At the ninth node I, the output signal from the phase detector 420 is the input signal to the integrator 432. At the tenth node J, the output signal from the integrator 432 is the control input signal to the phase shifter 431.

The labelling of nodes in FIG. 4 may also be used to reference the nodes between circuit elements in other embodiments and is provided as a guide to differentiate the signals in the frequency multiplier circuit 400 and in other circuits in other embodiments.

Figure 5A:
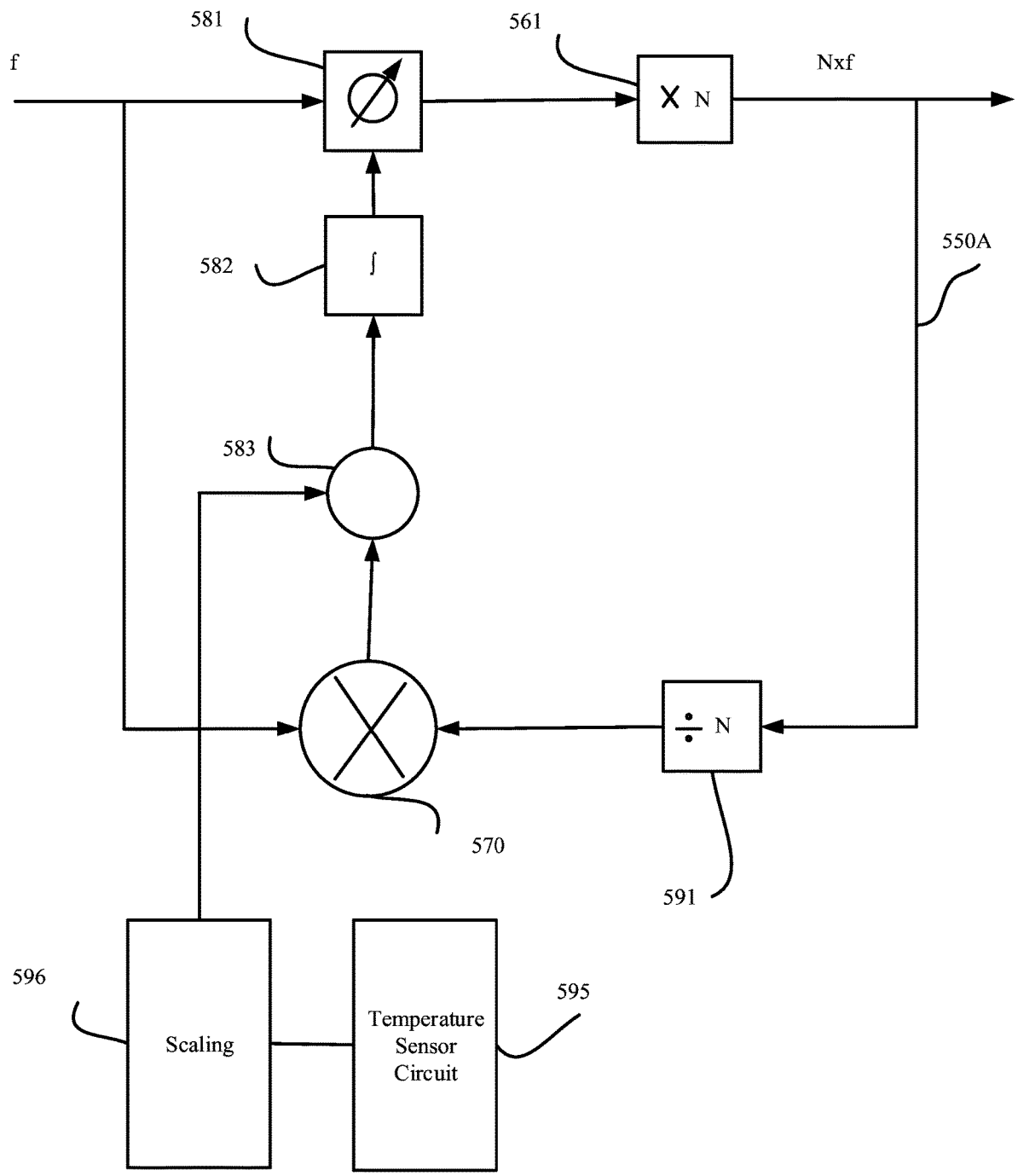
FIG. 5A is a block diagram illustrating another frequency multiplier circuit with phase stabilization, in accordance with a representative embodiment.

FIG. 5A is a block diagram illustrating another frequency multiplier circuit with phase stabilization, in accordance with a representative embodiment.

In FIG. 5A, the frequency multiplier circuit 500A includes a frequency multiplier 561, a phase detector 570, a frequency divider 591, an integrator 582, a variable phase shifter 581, a summer 583, a temperature sensor circuit 595 and a scaling circuit 596. In FIG. 5A, an analog control circuit is not shown, but may be included in an embodiment and may be considered to include the variable phase shifter 581 and the integrator 582.

In FIG. 5A, a first tap-off (not shown) taps an input in the frequency multiplier circuit 500A, and specifically the input to the frequency multiplier circuit 500 which is also the input to the variable phase shifter 581. The second tap-off (not shown) taps an output in the frequency multiplier circuit 500, and specifically the output from the frequency multiplier circuit 400 which is also the output from the frequency multiplier 561.

In FIG. 5A, the summer 583, the temperature sensor circuit 595 and the scaling circuit 596 are added relative to the embodiments of FIGS. 3A and 3B which do not include a temperature sensor circuit or a scaling circuit. The phase difference detected by the phase detector 570 can be offset based on a temperature detected by the temperature sensor circuit 595. The detected temperature can be scaled by the scaling circuit 596 so that the offset can be summed by the summer 583 with the output signal that is output by the phase detector 570. In other words, with the addition of the summer 83, the temperature sensor circuit 595 and the scaling circuit 596, the frequency multiplier circuit 500A adds an open loop adjustment to refine the adjustment of the control loop 550A that is otherwise based on the phase detector 570. The open loop adjustment from the direct temperature reading by the temperature sensor circuit 595 may reduce any remaining error. The remaining error may be adjusted down from ~2 ps/° C. The residual error of the phase drift correction scheme may be characterized by measuring the hardware with the temperature sensor circuit 595 and corrected by offsetting the residual error in the output signal that is output from the phase detector 570.

In FIG. 5A, a control loop 550A includes the variable phase shifter 581, the frequency multiplier 561, the frequency divider 591, the phase detector 570, the summer 583, and the integrator 582. A main path for the frequency multiplier circuit 500A is the direct path for the input signal with the input frequency f through the variable phase shifter 581 and the frequency multiplier 561 to result in the output signal with the output frequency N×f. Put differently, the main path is the direct path of energy through the frequency multiplier circuit 500A without being tapped off by a first tap-off or a second tap-off. The control loop 550A adds the control adjustment that is output from the integrator 582 to the variable phase shifter 581, so that the variable phase shifter 581 varies the phase of the input frequency f to follow the phase of the output frequency N×f. The control adjustment from the integrator 582 includes the primary adjustment based on the phase detector 570 and a secondary adjustment based on the added temperature sensor circuit 595 and the scaling circuit 596.

In another embodiment, the temperature sensor circuit 595 and the scaling circuit 596 may drive the variable phase shifter 581 directly based on temperature alone, without measuring the actual phase difference with the phase detector 570.

Figure 5B:
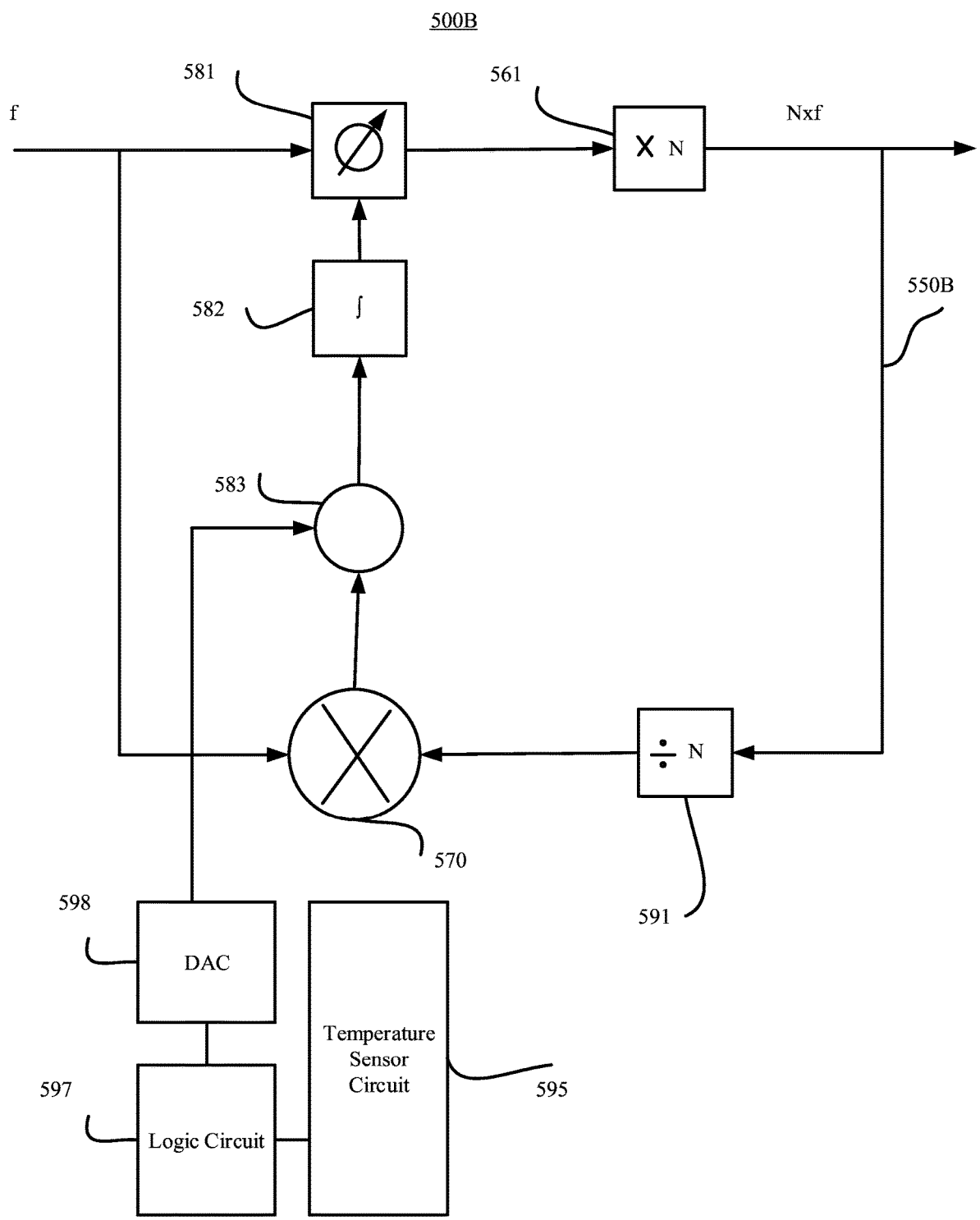
FIG. 5B is a block diagram illustrating another frequency multiplier circuit with phase stabilization, in accordance with a representative embodiment.

In FIG. 5B, the frequency multiplier circuit 500A includes the frequency multiplier 561, the phase detector 570, the frequency divider 591, the integrator 582, the variable phase shifter 581, the summer 583, the temperature sensor circuit 595, a logic circuit 597 and a digital-to-analog converter 598. As with FIG. 5A, in FIG. 5B an analog control circuit is not shown but may be included in an embodiment and may be considered to include the variable phase shifter 581 and the integrator 582.

In FIG. 5B, a first tap-off (not shown) taps an input in the frequency multiplier circuit 500B, and specifically the input to the frequency multiplier circuit 500 which is also the input to the variable phase shifter 581. The second tap-off (not shown) taps an output in the frequency multiplier circuit 500, and specifically the output from the frequency multiplier 561.

In FIG. 5B, the summer 583, the temperature sensor circuit 595, the logic circuit 597 and the digital-to-analog converter 598 are added relative to the embodiments of FIGS. 3A and 3B which do not include a temperature sensor circuit, a logic circuit or a digital-to-analog converter. The phase difference detected by the phase detector 570 can again be offset based on a temperature detected by the temperature sensor circuit 595. The detected temperature can be scaled based on software stored in a memory and executed by a processor (e.g., a microprocessor) in the logic circuit 597, or based on logic implemented by, for example, an application-specific integrated circuit (ASIC) as the logic circuit 597. The offset can be summed by the summer 583 and is provided by the digital-to-analog converter 598 based on the logic from the logic circuit 597. The digital-to-analog converter 598 is therefore driven by the logic circuit 597, which in turn determines the offset to provide based on the temperature sensed by the temperature sensor circuit 595.

In FIG. 5B, a control loop 550B includes the variable phase shifter 581, the frequency multiplier 561, the frequency divider 591, the phase detector 570, the summer 583, and the integrator 582. A main path for the frequency multiplier circuit 500B is the direct path for the input signal with the input frequency f through the variable phase shifter 581 and the frequency multiplier 561 to result in the output signal with the output frequency N×f. The main path is the direct path of energy through the frequency multiplier circuit 500B without being tapped off by a first tap-off or a second tap-off. In other words, the main path in FIG. 5B and in other embodiments described herein is the path taken by components of the input signal that are input to the frequency multiplier circuit 500B (or another frequency multiplier circuit) until the components are output as an output signal from the frequency multiplier circuit 500B (or another frequency multiplier circuit), without being tapped by either the first tap-off or the second tap-off. The control loop 550B adds the control adjustment that is output from the integrator 582 to the variable phase shifter 581, so that the variable phase shifter 581 varies the phase of the input frequency f to follow the phase of the output frequency N×f. The control adjustment from the integrator 582 includes the primary adjustment based on the phase detector 570 and a secondary adjustment based on the added temperature sensor circuit 595, the logic circuit 597 and the digital-to-analog converter 598.

In another embodiment, the temperature sensor circuit 595, the logic circuit 597 and the digital-to-analog converter 598 may drive the variable phase shifter 581 directly based on temperature alone, without measuring the actual phase difference with the phase detector 570. In an implementation of the frequency multiplier circuit with phase stabilization described herein, an initial measurement shows a sensitivity of time delay through a multi-channel instrumentation that provides 10 MHz input to 100 MHz output to temperature change of 5.4 picoseconds/degree (Celsius) with the control loop enabled. The same circuit for the multi-channel instrumentation with the control loop disabled and the phase-shift control voltage held constant shows a sensitivity of 22.9 picoseconds/degree (Celsius). Accordingly, activating the control loop of a frequency multiplier circuit as described herein may lower the sensitivity by a factor of 4.

Accordingly, phase stabilization for a frequency multiplier enables stabilization so that a phase of an output signal from a frequency multiplier circuit follows a phase of an input signal to the frequency multiplier circuit.

Adding the components of a control loop to a frequency multiplier as shown and described herein lowers the sensitivity of the delay through the circuit to temperature. As described herein, phase stabilization for a frequency multiplier lowers the temperature-sensitivity of the time delay through a frequency multiplier.

Although phase stabilization for a frequency multiplier has been described with reference to several exemplary embodiments, it is understood that the words that have been used are words of description and illustration, rather than words of limitation. Changes may be made within the purview of the appended claims, as presently stated and as amended, without departing from the scope and spirit of phase stabilization for a frequency multiplier in its aspects. Although phase stabilization for a frequency multiplier has been described with reference to particular means, materials and embodiments, phase stabilization for a frequency multiplier is not intended to be limited to the particulars disclosed; rather phase stabilization for a frequency multiplier extends to all functionally equivalent structures, methods, and uses such as are within the scope of the appended claims.

Additionally, phase stabilization as described herein may also be used for frequency multipliers and/or frequency translators even when the multiplication and/or translation does not involve integer values. As an example, if a frequency multiplier multiplies an input frequency f by five to result in an output frequency of 5*f, and the output frequency of 5*f is then divided by, a two by a frequency divider to produce 5*/2, the effective multiplication through the frequency multiplier and the frequency divider is N=2.5. If the frequency multiplier and the frequency divider combined are considered a frequency multiplier circuit, the output frequency of the frequency multiplier circuit can be divided by five and the input frequency f of the input signal that is input to the frequency multiplier circuit can be divided by two so that a phase detector compares a comparable input phase and output phase at ½ of the input frequency f of the input signal that is input to the frequency multiplier circuit.

Figure 6A:
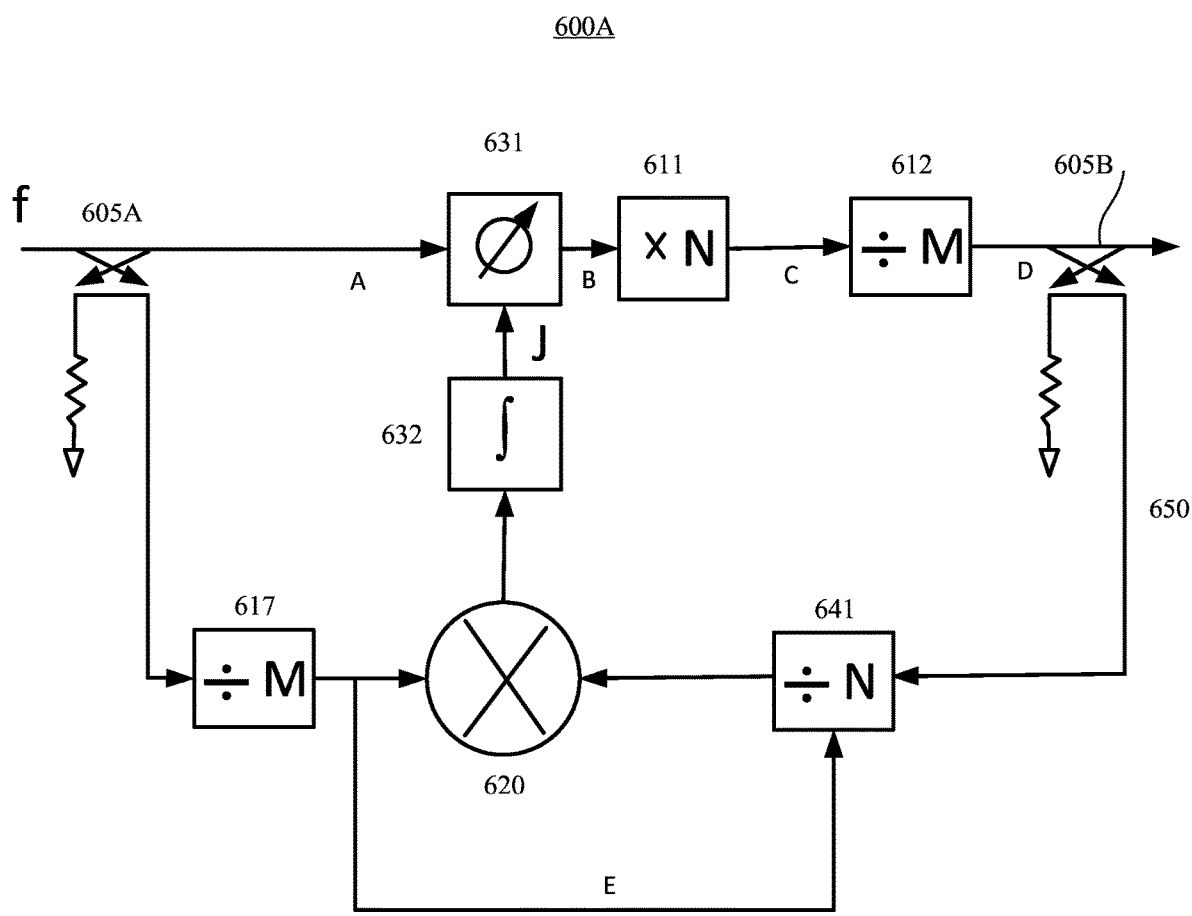
FIG. 6A is a block diagram illustrating another frequency multiplier circuit with phase stabilization, in accordance with a representative embodiment.

FIG. 6A is a block diagram illustrating another frequency multiplier circuit with phase stabilization, in accordance with a representative embodiment.

In FIG. 6A, the frequency multiplier circuit 600A includes a first tap-off 605a, a second tap-off 605b, a phase shifter 631, a frequency multiplier 611, a first frequency divider 641, a phase detector 620, an integrator 632, a second frequency divider 617 and a third frequency divider 612. Relative to previous embodiments, at least the second frequency divider 617 and the third frequency divider 612 are added or changed.

In FIG. 6A, the first tap-off 605A taps an input in the frequency multiplier circuit 600A, and specifically the input to the frequency multiplier circuit 600A which is also the input to the phase shifter 631. The second tap-off 605B taps an output in the frequency multiplier circuit 600A, and specifically the output from the third frequency divider 612. Either or both of the first tap-off 605A and/or the second tap-off 605B may be directional so that tapped signals are limited to forward travelling waves.

In FIG. 6A, another circuit element such as a filter can be placed in any of the nodes labelled A, B, C and D in the main path of the frequency multiplier circuit 600A. If M and N are both set to 1, the frequency multiplier circuit 600A will stabilize the output phase of the added circuit element versus the input to the added circuit element. Notably also, each of the phase shifter 631, the frequency multiplier 611, the third frequency divider 612 and the added circuit element at any of the nodes A, B, C and D can be re-ordered in any manner without impacting the phase stabilization. In other words, in FIG. 6A all elements along the main path between the two taps can be re-ordered in any way.

Also, as shown in FIG. 6A, the added second frequency divider 617 and third frequency divider 612 allows for non-integer multiplication outputs. The input signal that is input to the frequency multiplier circuit 600A is divided by M, and the output signal that is output from the frequency multiplier 611 is sequentially divided by M and N after being multiplied by N in the frequency multiplier 611. As a result, both inputs to the phase detector 620 are at the same frequency and the output of the frequency multiplier circuit is equal to f*N/M. There are many non-integer values that could be represented by F*N/M and that could be produced by different combinations of N and M even assuming that N and M are integers. For example, if N is equal to 3 and M equal to 2, the result is P3/2. Accordingly, phase stabilization as described herein can also be provided even for a frequency multiplier circuit that produces a non-integer output.

Figure 6B:
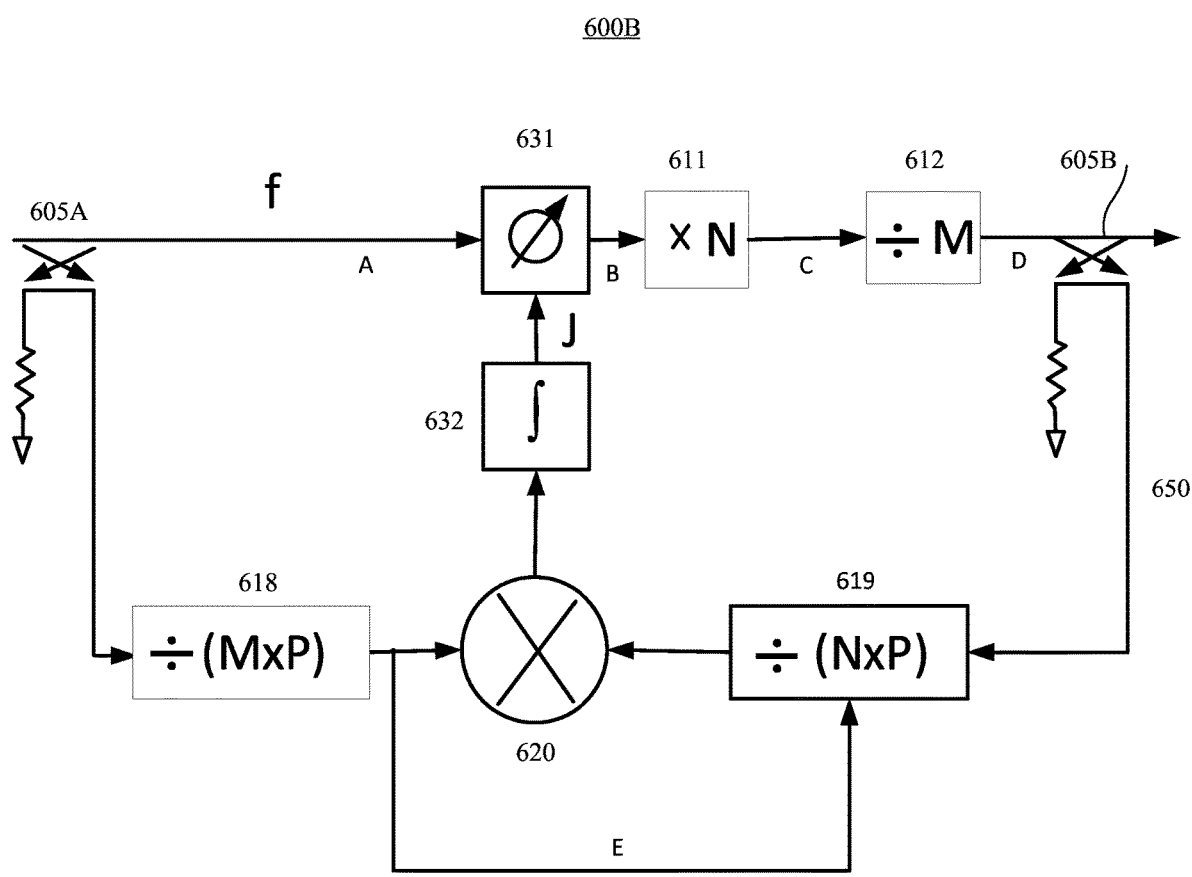
FIG. 6B is a block diagram illustrating another frequency multiplier circuit with phase stabilization, in accordance with a representative embodiment.

FIG. 6B is a block diagram illustrating another frequency multiplier circuit with phase stabilization, in accordance with a representative embodiment.

In FIG. 6B, the frequency multiplier circuit 600B includes a first tap-off 605a, a second tap-off 605b, a phase shifter 631, a frequency multiplier 611, a phase detector 620, an integrator 632, first frequency divider 619, a second frequency divider 618 and a third frequency divider 612. Relative to previous embodiments, at least the first frequency divider 619, the second frequency divider 618 and the third frequency divider 612 are added or changed.

In FIG. 6B, the first tap-off 605A taps an input in the frequency multiplier circuit 600A, and specifically the input to the frequency multiplier circuit 600A which is also the input to the phase shifter 631. The second tap-off 605B taps an output in the frequency multiplier circuit 600A, and specifically the output from the third frequency divider 612. Either or both of the first tap-off 605A and/or the second tap-off 605B may be directional so that tapped signals are limited to forward travelling waves.

In the frequency multiplier circuit 600B, a factor P is added in to the second frequency divider 618 and the third frequency divider 612. As a result, the factor P is added in to both inputs to the phase detector 620. The factor P adds in an ability to lower the frequency at which the phase detector 620 operates. Any of the factors M, N and P in the embodiment of FIG. 6B is an integer one or larger.

In FIG. 6B, another circuit element such as a filter can again be placed in any of the nodes labelled A, B, C and D in the main path of the frequency multiplier circuit 600B, and any of the circuit elements at any of the nodes A, B, C and D can again be re-ordered in any manner without impacting the phase stabilization.

In FIG. 6B, any of the factors, N, M and P are integer one or larger, though setting the value to 1 will be the same as removing that factor. The output of the frequency multiplier circuit 600B is f*N/M. Additionally, both inputs to the phase detector 620 in FIG. 6B are f/(M×P), which provides an ability to substantially lower the frequency at which the phase detector 620 operates.

In both FIGS. 6A and 6B, a node E delineates a reset path that can be used once to reset the first frequency divider 641 or the first frequency divider 619, respectively. The frequency path starts between the phase detector 620 and the output of the second frequency divider 617 or the second frequency divider 618, respectively.

As described herein, phase stabilization may also be used and useful even when N=1. That is, phase stabilization may be provided to stabilize the phase of a filter or other circuit that may have excessive phase-shift over temperature, even when the filter or other circuit does not specifically produce frequency multiplication or frequency division with a variable other than 1.

The illustrations of the embodiments described herein are intended to provide a general understanding of the structure of the various embodiments. The illustrations are not intended to serve as a complete description of all of the elements and features of the disclosure described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The preceding description of the disclosed embodiments is provided to enable any person skilled in the art to practice the concepts described in the present disclosure. As such, the above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents and shall not be restricted or limited by the foregoing detailed description.

What is claimed:

1. A frequency multiplier circuit, comprising:
a frequency multiplier;
a first tap-off that directionally taps an input in the frequency multiplier circuit at a first frequency;
a second tap-off that directionally taps an output in the frequency multiplier circuit;
a phase detector that detects a difference between an input phase of the input in the frequency multiplier circuit at the first frequency and an output phase of the output in the frequency multiplier circuit; and
a control circuit configured to maintain the output phase based on the difference detected by the phase detector.

2. The frequency multiplier circuit of claim 1,
wherein the second tap-off directionally taps the output in the frequency multiplier circuit at a second frequency different from the first frequency and resultant from frequency multiplication by the frequency multiplier,
wherein at least one of the first tap-off and the second tap-off comprises a directional coupler, and
wherein the phase detector detects the difference between the input phase of the input in the frequency multiplier circuit at the first frequency and the output phase of the output in the frequency multiplier circuit at the second frequency.

3. The frequency multiplier circuit of claim 1,
wherein the second tap-off directionally taps the output in the frequency multiplier circuit at a second frequency different from the first frequency, and
wherein the second frequency is a non-integer multiple of the first frequency.

4. The frequency multiplier circuit of claim 1,
wherein the first tap-off has directivity so as to limit coupling to waves of the input travelling forward; and
the second tap-off has directivity so as to limit coupling to waves of the output travelling forward.

5. The frequency multiplier circuit of claim 4, wherein reflections of the input in the frequency multiplier circuit and reflections to the output in the frequency multiplier circuit are not tapped by the first tap-off or the second tap-off.

6. The frequency multiplier circuit of claim 1, further comprising:
a temperature sensor that senses a temperature of the frequency multiplier circuit,
wherein the difference detected by the phase detector is adjusted based on the temperature sensed by the temperature sensor, and
wherein the second tap-off directionally taps the output in the frequency multiplier circuit at a second frequency different from the first frequency.

7. The frequency multiplier of claim 6, further comprising:
a summer that adds an adjustment based on the temperature sensed by the temperature sensor to an output of the phase detector that is based on the difference between the input phase of the input in the frequency multiplier circuit at the first frequency and the output phase of the output in the frequency multiplier at the second frequency.

8. The frequency multiplier of claim 1, wherein the control circuit comprises a phase shift circuit with an inductor and a variable capacitor.

9. A frequency multiplier circuit, comprising:
a frequency multiplier;
a phase comparator that compares a difference between an input phase of an input in the frequency multiplier circuit and an output phase of an output in the frequency multiplier circuit;

a phase shift circuit that varies a phase-shift to persistently adjust the output phase to follow the input phase;

a temperature sensor that senses a temperature of the frequency multiplier circuit; and a controller that controls the phase shift circuit based on the difference between the input phase and the output phase and the temperature sensed by the frequency multiplier circuit.

10. The frequency multiplier circuit of claim 9, wherein the phase shift circuit comprises an inductor and a variable capacitor.

11. The frequency multiplier circuit of claim 9, further comprising:

a frequency divider configured to divide the output in the frequency multiplier circuit in synchronization with an input to the frequency multiplier.

12. The frequency multiplier circuit of claim 11, further comprising:

a control loop that includes the phase comparator, the controller and the frequency divider, wherein the frequency divider is synchronized based on an input phase of the input to the frequency multiplier, and the output from the frequency multiplier has N cycles in one cycle of an input frequency of the input to the frequency multiplier.

13. The frequency multiplier circuit of claim 12, further comprising:

a switch in the control loop that is selectively turned off and on until an output phase of the output from the frequency divider is in one of N phase-states closest to aligning with the input phase of the input to the frequency multiplier.

14. The frequency multiplier circuit of claim 13, wherein the frequency divider is started by the input to the frequency multiplier to align the output phase of the output from the frequency divider with the input phase of the input to the frequency multiplier circuit.

15. The frequency multiplier of claim 13, wherein the control loop is locked based on a difference between the input phase and the output phase reaching zero such that the output phase is following the input phase.

16. A frequency multiplier circuit, comprising:

a frequency multiplier;

a frequency divider;

a control circuit;

a phase detector that detects a phase difference between an input phase of an input to the frequency multiplier and an output phase of an output from the frequency divider; and a switch that is selectively turned off and on until the phase difference between the output phase of the output from the frequency divider and the input phase of the input to the frequency multiplier can be driven towards zero by the control circuit.

17. The frequency multiplier circuit of claim 16, further comprising:

a control loop that includes the phase detector, the control circuit and the frequency divider, wherein the output from the frequency multiplier has N cycles in one cycle of an input frequency of the input to the frequency multiplier.

18. The frequency multiplier circuit of claim 17, further comprising:

a switch in the control loop that is selectively turned off and on until an output phase of the output from the frequency divider is in one of N phase-states closest to aligning with the input phase of the input to the frequency multiplier.

19. The frequency multiplier circuit of claim 17, wherein the frequency divider is started by the input to the frequency multiplier to align the output phase of the output from the frequency divider with the input phase of the input to the frequency multiplier circuit.

20. The frequency multiplier of claim 17, wherein the control loop is locked based on a difference between the input phase and the output phase reaching zero such that the output phase is following the input phase.

* * * * *